United States Patent
Ohmi et al.

(10) Patent No.: US 8,691,017 B2
(45) Date of Patent: Apr. 8, 2014

(54) HEAT EQUALIZER AND ORGANIC FILM FORMING APPARATUS

(75) Inventors: Tadahiro Ohmi, Sendai (JP); Masafumi Kitano, Sendai (JP); Hisaaki Yamakage, Minato-ku (JP); Yoshihito Yamada, Minato-ku (JP)

(73) Assignees: National University Corporation Tohoku University, Sendai-shi (JP); Toshiba Mitsubishi—Electric Industrial Systems Corporation, Tokyo (JP)

( * ) Notice: Subject to any disclaimer, the term of this patent is extended or adjusted under 35 U.S.C. 154(b) by 863 days.

(21) Appl. No.: 12/934,190

(22) PCT Filed: Apr. 11, 2008

(86) PCT No.: PCT/JP2008/057205
§ 371 (c)(1),
(2), (4) Date: Sep. 23, 2010

(87) PCT Pub. No.: WO2009/125497
PCT Pub. Date: Oct. 15, 2009

(65) Prior Publication Data
US 2011/0041768 A1 Feb. 24, 2011

(51) Int. Cl.
| | | |
|---|---|---|
| C23C 16/00 | (2006.01) |
| F22B 1/02 | (2006.01) |
| F02B 75/00 | (2006.01) |
| F27D 11/00 | (2006.01) |
| A01G 13/06 | (2006.01) |
| A01M 13/00 | (2006.01) |
| A01M 19/00 | (2006.01) |
| A61B 16/00 | (2006.01) |
| A61L 9/03 | (2006.01) |
| B01B 1/00 | (2006.01) |
| F02M 15/04 | (2006.01) |
| F02M 31/12 | (2006.01) |
| F22B 1/20 | (2006.01) |
| B01D 7/00 | (2006.01) |
| C23C 14/00 | (2006.01) |
| A61H 33/06 | (2006.01) |
| B01D 1/00 | (2006.01) |
| B01D 3/00 | (2006.01) |
| B05B 1/24 | (2006.01) |
| F22B 1/28 | (2006.01) |
| F24F 6/00 | (2006.01) |
| A61H 33/12 | (2006.01) |
| D06F 75/00 | (2006.01) |
| F17C 7/04 | (2006.01) |

(52) U.S. Cl.
USPC .............. 118/726; 122/31.1; 122/33; 122/39; 219/439; 392/386; 392/394; 392/403; 392/387; 392/388; 392/389

(58) Field of Classification Search
USPC .............. 118/726; 122/31.1, 33, 39; 219/439; 392/386–389, 394, 403
See application file for complete search history.

(56) References Cited

FOREIGN PATENT DOCUMENTS

| JP | 2 164401 | 6/1990 |
| JP | 9 49072 | 2/1997 |
| JP | 10 168560 | 6/1998 |
| JP | 2001 234335 | 8/2001 |
| JP | 2002 184571 | 6/2002 |
| JP | 2004 315898 | 11/2004 |
| WO | 2007 034790 | 3/2007 |

*Primary Examiner* — Keath Chen
(74) *Attorney, Agent, or Firm* — Oblon, Spivak, McClelland, Maier & Neustadt, L.L.P.

(57) ABSTRACT

A heat equalizer includes a container structure having a heating block in which a working fluid is held for heating and vaporizing a material to be heated, a heater placed at the bottom of the container structure, and a material feed pipe allowing the outside and the inside of the container structure to communicate with each other. In the heating block, as a flow path in which the material to be heated flows, a main header pipe connected to the material feed pipe and extending in the horizontally, and a riser pipe branching from the main header pipe and extending vertically are formed. As a condensation path in which the working fluid is cooled and condensed, condensation holes formed respectively on the opposite sides of the riser pipe and extending horizontally, and a condensation pit formed under the riser pipe are formed. Between the condensation holes and the condensation pit, the main header pipe is placed.

14 Claims, 19 Drawing Sheets

HEAT EQUALIZER AND ORGANIC FILM FORMING APPARATUS

TECHNICAL FIELD

The present invention relates to a heat equalizer used particularly for an organic film forming apparatus, a heat equalizer for heating a material that is a predetermined material carried in a container, and an organic film forming apparatus using the heat equalizer.

BACKGROUND ART

Regarding conventional organic EL (Electro-Luminescence) production, for example, when a film is to be formed on a substrate using an organic EL material in the form of powder, an evaporation apparatus for the organic EL material generally uses a heating system of heating the exterior of an evaporation tray by means of a heater to sublimate or to melt and evaporate the organic EL material in the evaporation tray. A conventional apparatus used for such heat treatment is disclosed for example in WO 2007/034790 (Patent Document 1).

FIG. 19 is a side view of an evaporation container used for the conventional heat treatment. FIG. 20 is a plan view of the evaporation container used for the conventional heat treatment. As shown in FIGS. 19 and 20, the evaporation container is configured to include an evaporation tray 50 having a bottom and a side extending substantially upright from the bottom to define an open material-holding space within the side, and a partition plate 52 dividing the material-holding space into a plurality of partial spaces. Partition plate 52 has a retaining piece 54 having a height that allows the plurality of partial spaces to communicate with each other on the bottom side of the evaporation tray.

FIG. 21 is a schematic diagram showing a modification of the conventional partition plate. FIG. 21 shows heating means including heat pipes 741, 761 for heating the bottom and the side of the evaporation tray as well as the inside of the partition plate.

Patent Document 1: WO 2007/034790

DISCLOSURE OF THE INVENTION

Problems to be Solved by the Invention

In the conventional heating apparatus disclosed in Patent Document 1, a material that is a predetermined material is fed to the communication area on the bottom side of the evaporation tray, heated on the bottom and the side of the evaporation tray as well as the partition plate and accordingly evaporated. Because the fed material is held and heated in the communication area on the bottom side of the evaporation tray, the material stagnates in a part of the communication area on the bottom, particularly in a corner portion formed by the side and the partition plate. When the stagnation occurs, the material cannot be heated, evaporated and successively replaced with a new material in each part of the evaporation tray adequately. It is therefore difficult to heat and evaporate each part of the material in the evaporation tray under a uniform temperature history condition, resulting in a problem that the quantity of the evaporated material varies depending on the part of the material.

As for the conventional heating apparatus that is disclosed in Patent Document 1 and includes the heat pipe within the partition plate, it is necessary that the partition plate has a sufficient thickness for carrying the heat pipe therein. In order to smoothly circulate a working fluid in the heat pipe, it is necessary that the heat pipe has a certain diameter or more, for example, a diameter of not less than 7 to 8 mm in the case where the working fluid is water. A resultant problem is an increased thickness of the partition plate and an increased size of the evaporation tray, as well as delay in thermal response of the heating apparatus.

As for a conventional heating apparatus that is disclosed in Patent Document 1 and configured so that the bottom and the side of the evaporation tray have a double structure and a heat pipe provided within the partition plate and this double-structure portion communicate with each other, the double-structure portion is subjected to, when the evaporation tray is heated to a required temperature, an internal pressure that is a vapor pressure of the working fluid in the heat pipe and depends on the operating temperature. For example, the vapor pressure is approximately 1.6 MPa when water is used as the working fluid and the operating temperature is 200° C., and the vapor pressure is approximately 1.9 MPa when naphthalene is used as the working fluid and the operating temperature is 400° C. The double-structure portion, however, is not configured to keep a strength against the internal pressure when heated at a high temperature. A resultant problem is therefore that the risk of deformation or breakage of the evaporation tray arises at a high temperature.

The present invention has been made to solve the problems above, and an object of the invention is to provide a heat equalizer that successively heats a material to be heated, at each part in the heat equalizer, and equalizes the temperature of the material to be heated so that the material is stably vaporized, and that can sufficiently withstand the vapor pressure of the working fluid even at a high temperature.

Means for Solving the Problems

A heat equalizer according to the present invention includes a container structure, heating means, and a material feed pipe. The container structure has a closed space which is formed in the container structure and in which a working fluid is held. The heating means is placed at a bottom of the container structure. The material feed pipe allows an outside and an inside of the container structure to communicate with each other. The container structure has a heating block for heating and vaporizing a material to be heated, and a housing surrounding the heating block. In the heating block, a flow path in which the material to be heated flows is formed. The flow path includes a first flow path connected to the material feed pipe and extending in a horizontal direction, a second flow path branching from the first flow path and extending in a vertical direction, and an opening formed by an opening of the second flow path at an upper surface of the container structure. In the heating block, a condensation path is also formed. In the condensation path, the working fluid having been heated and evaporated by the heating means is cooled and condensed. The condensation path includes upper condensation holes formed respectively on opposite sides of the second flow path and extending in the horizontal direction, and a lower condensation pit formed under the first flow path. The first flow path is placed between the upper condensation holes and the lower condensation pit.

Effects of the Invention

According to the present invention, on the inner wall surface of the condensation path provided in the heating block, a gaseous working fluid is cooled to be condensed to heat the heating block, and the heated heating block has an equalized temperature. Therefore, a material to be heated that is heated while being passed through the flow path in the heating block can be heated to an equalized temperature. Further, the flow path is formed so that the material to be heated continuously flows from the inlet to the outlet of the flow path. Thus, the material to be heated does not partially stay at a part of the flow path, and the uniformity of the heating history of the material to be heated can be improved. Furthermore, the flow path for the material to be heated has a small diameter, so that convection of the melt of the material to be heated passing through the flow path can be suppressed. In this way, the uniformity in temperature of the material to be heated that has been heated and vaporized can be improved, and accordingly the heat equalizer applicable to a vapor deposition apparatus for forming a film with high precision can be obtained.

Figure 1:
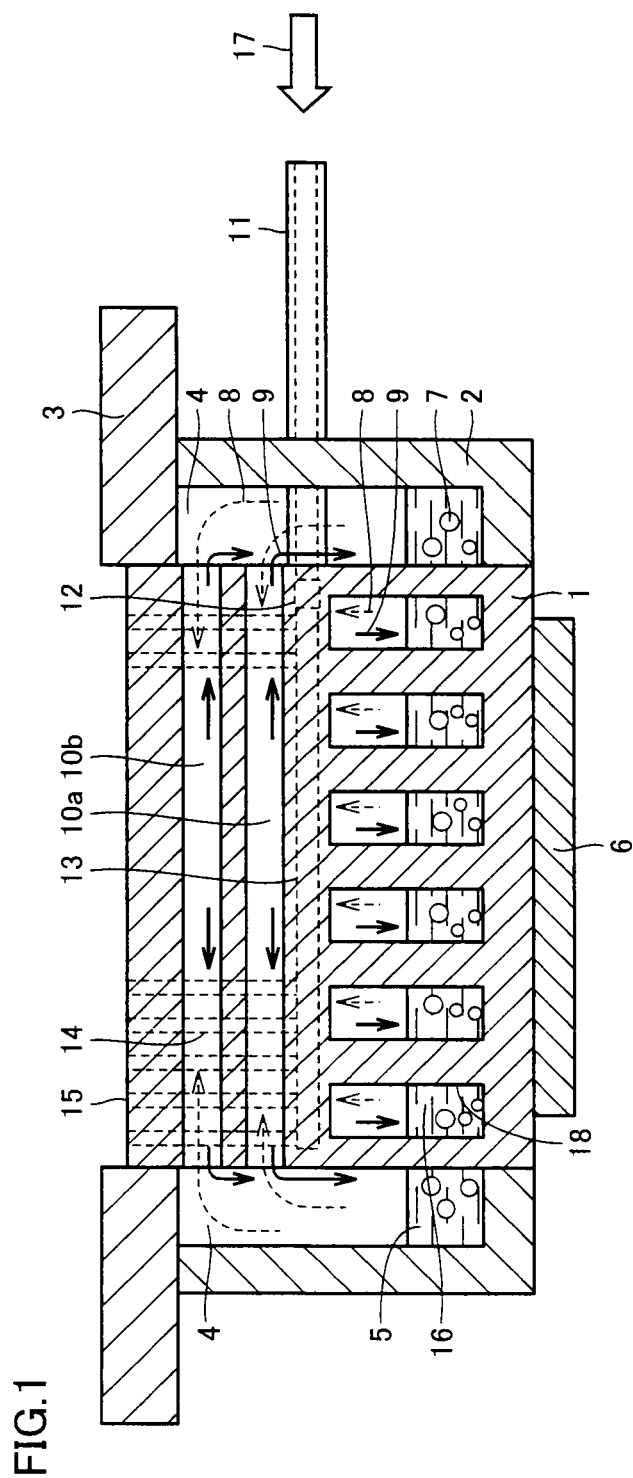
FIG. 1 is a cross section of a heat equalizer in a first embodiment.

DESCRIPTION OF THE REFERENCE SIGNS 1 heating block; 2 housing; 3 flange; 4 hollow portion; 5 working fluid; 6 heating means; 7 vapor bubble; 8, 9, 17, 20 arrow; 10, 10a, 10b condensation hole; 11 material feed pipe; 12 main header pipe; 13 branch header pipe; 14 riser pipe; 15 opening; 16 condensation pit; 18 column; 21 pipe system; 22 condensation pit; 23 evaporator; 24 vapor pipe; 25 liquid pipe; 26 second working fluid; 27 second heating means

BEST MODES FOR CARRYING OUT THE INVENTION

Embodiments of the present invention will hereinafter be described based on the drawings. In the following drawings, the same or corresponding parts are denoted by the same reference characters, and a description thereof will not be repeated.

It should be noted that each component in the embodiments described below is not necessarily requisite to the present invention unless otherwise noted. Further, the number, quantity or the like specified in the following embodiments is only by way of illustration unless otherwise noted, and the scope of the present invention is not necessarily limited to the specified number, quantity or the like.

First Embodiment

Figure 2:
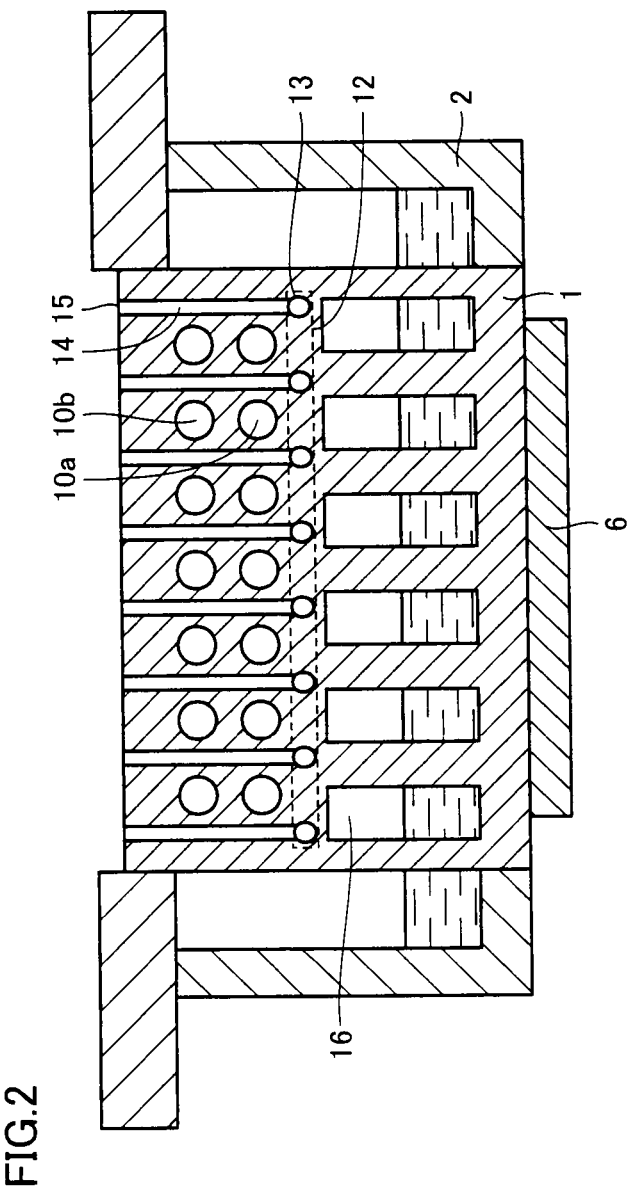
FIG. 2 is a cross section of the heat equalizer orthogonal to the cross section shown in FIG. 1.
Figure 3:
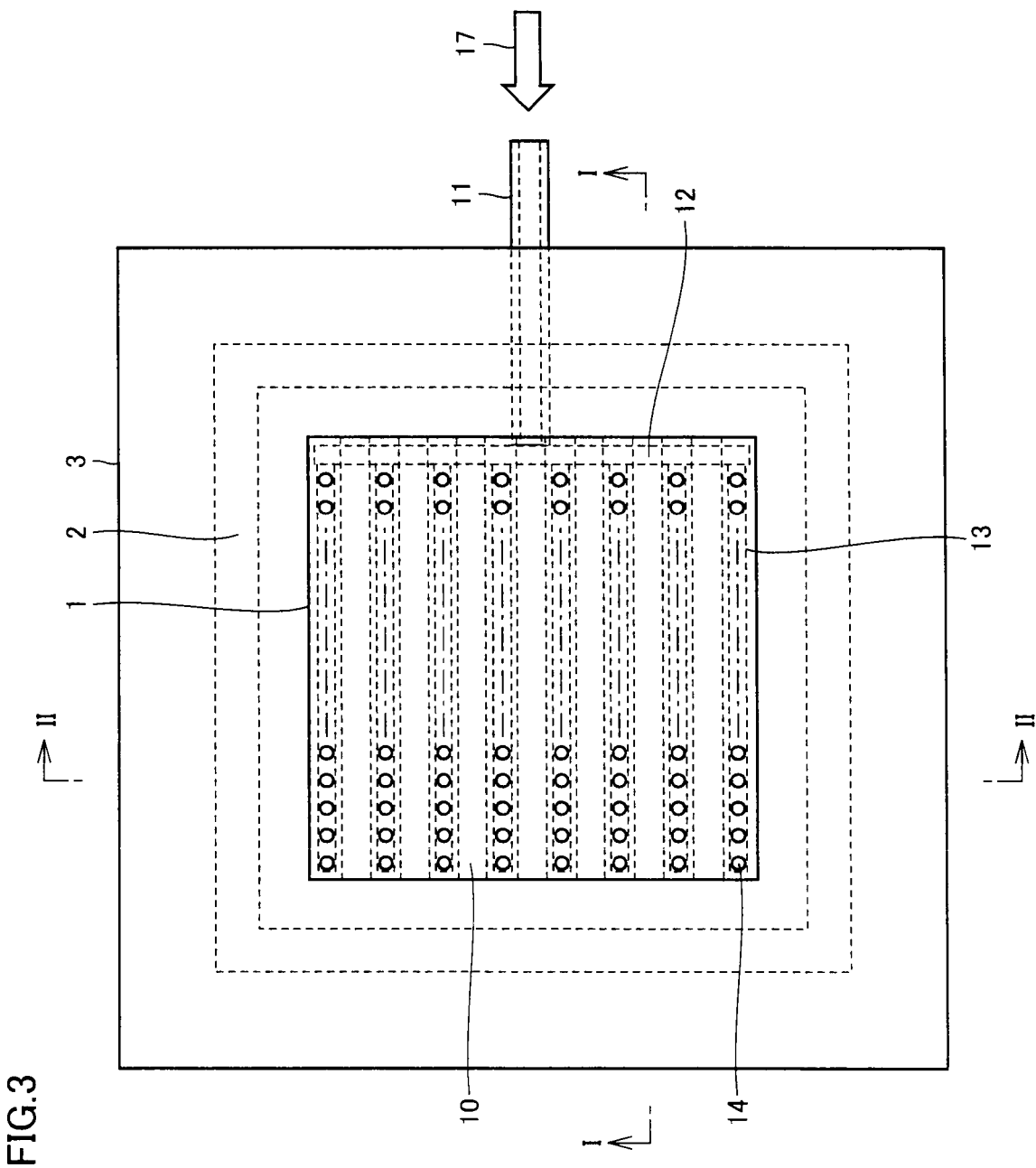
FIG. 3 is a plan view of an upper portion of the heat equalizer shown in FIGS. 1 and 2.

FIG. 1 is a cross section of a heat equalizer in a first embodiment. FIG. 2 is a cross section of the heat equalizer that is orthogonal to the cross section shown in FIG. 1. FIG. 3 is a plan view of an upper portion of the heat equalizer shown in FIGS. 1 and 2. In the following embodiments, "horizontal direction" refers to the lateral direction in cross sections of the heat equalizer, and "vertical direction" refers to the top-bottom direction in these cross sections.

As shown in FIGS. 1 to 3, the heat equalizer includes a heating block 1 and a housing 2 placed to surround the periphery of heating block 1. The heat equalizer also includes a flange 3. Heating block 1 and housing 2 have respective upper ends joined to flange 3, and respective lower portions joined to each other to form a container structure having a hollow portion 4 that is a closed space formed in the container structure. The container structure has heating block 1 and housing 2.

In an upper portion of heating block 1, condensation holes 10a, 10b extending in the horizontal direction through heating block 1 are formed. Condensation holes 10a, 10b are each a circular hole having a circular cross section along the radial direction of the hole, and also a linear hole extending linearly in its depth direction. The depth direction of condensation holes 10a, 10b is along the horizontal direction. As shown in FIG. 2, a plurality of condensation holes 10a and a plurality of condensation holes 10b are formed. Condensation holes 10a, 10b each have the opposing two ends that are open toward hollow portion 4. Condensation holes 10a, 10b are formed so that right hollow portion 4 and left hollow portion 4 in the container structure shown in FIG. 1 communicate with each other.

In hollow portion 4, a working fluid 5 that is a liquid working fluid is held. The working fluid is a heat medium used for transferring heat between heating means 6, which serves as a heat source, and heating block 1, so as to heat heating block 1 and thereby control the temperature so that the temperature is set at a target temperature. Working fluid 5 is selected in consideration of thermal properties and the operating pressure (vapor pressure) at a temperature in use. In general, water is used as the working fluid for a temperature range of approximately not more than 200° C., and an organic heat medium of a high boiling point such as Dowtherm® A and naphthalene is used as the working fluid for a high temperature range of approximately higher than 200° C. and not more than 400° C.

Working fluid 5 is held in hollow portion 4 after hollow portion 4 is evacuated of air. Therefore, in hollow portion 4, a gaseous working fluid is present that is vaporized working fluid 5. Since hollow portion 4 is formed to separate heating block 1 and housing 2 from each other, dissipation of heat from heating block 1 to the outside of the heat equalizer is substantially prevented.

At the bottom of the container structure, heating means 6 for heating working fluid 5 is placed. Heating means 6 is attached to the lower surface of heating block 1 so that they are in thermal contact with each other. Namely, the heat generated by heating means 6 can be sufficiently and efficiently transferred to working fluid 5 via the bottom of heating block 1.

Heating of heating means 6 causes vapor bubbles 7 to be generated in working fluid 5. A part of the gaseous working fluid that has been heated and evaporated by heating means 6 moves from the liquid surface of working fluid 5 into condensation holes 10a, 10b as indicated by an arrow 8. The gaseous working fluid having moved into condensation holes 10a, 10b transfers heat to the inner wall surfaces of condensation holes 10a, 10b, and is accordingly cooled and condensed into a liquid. The working fluid condensed into the liquid state is returned to a working fluid retaining portion in the bottom portion of the container structure as indicated by an arrow 9. In FIG. 1, arrow 8 of the broken line indicates the flow of the working fluid in the gaseous state, and arrow 9 of the solid line indicates the flow of the working fluid in the liquid state.

The heat equalizer also includes a material feed pipe 11 that allows the outside and the inside of the container structure to communicate with each other. Material feed pipe 11 is inserted from the outside of the container structure and joined to one side of heating block 1. A material to be heated, which is a material to be heated and vaporized by this heat equalizer, is fed via material feed pipe 11 into the heat equalizer. In order for the material to be heated to pass through tubular material feed pipe 11, the material to be heated has to be a fluid. In the case where the material to be vaporized is solid at normal temperature, the fluidity of the material can be improved by, for example, heating and thereby melting the material, or grinding the material into powder and mixing the powder with a liquid to form a slurry, so as to allow the material to pass through the inside of material feed pipe 11.

In heating block 1, a main header pipe 12 connected to material feed pipe 11 and extending in the horizontal direction, a plurality of branch header pipes 13 branching from main header pipe 12 and extending in the horizontal direction, and a plurality of riser pipes 14 branching from branch header pipes 13 and extending in the vertical direction are formed. Main header pipe 12, branch header pipes 13, and riser pipes 14 are tubular members. The upper end of riser pipe 14 opens at the upper surface of heating block 1 to form an opening 15. Main header pipe 12, branch header pipes 13, riser pipes 14, and openings 15 are included in a flow path in which the material to be heated flows.

A plurality of condensation pits 16 are formed in heating block 1 and under the portion where the flow path of the material to be heated is formed. A plurality of condensation pits 16 extend in the vertical direction. The depth direction of condensation pits 16 is along the vertical direction. Condensation pits 16 are formed under main header pipe 12, branch header pipes 13, and riser pipes 14. Condensation pits 16 and hollow portion 4 are formed so that the pits and hollow portion 4 communicate with each other, and working fluid 5 can freely flow in hollow portion 4 and in condensation pits 16.

Condensation pit 16 may have any shape in plan view. For example, the shape may be rectangular or circular. Condensation pits 16 may be arranged in any manner, as long as the condensation pits are designed so that the condensation pits are capable of storing working fluid 5 and minimize the influence of transfer of heat from heating means 6 to the flow path of the material to be heated that is provided in the upper portion of heating block 1.

A part of the gaseous working fluid that is heated and evaporated by heating means 6 moves from the liquid surface of working fluid 5 into condensation pit 16 as indicated by arrow 8. The gaseous working fluid having moved into condensation pit 16 transfers heat to the inner wall surface of condensation pit 16. Accordingly, the working fluid is cooled to be condensed into a liquid state. The working fluid having been condensed into the liquid state is returned to the working fluid retaining portion at the bottom of the container structure as indicated by arrow 9.

Condensation holes 10a, 10b are formed to extend in a space where riser pipes 14 are absent, so that the condensation holes do not interfere with riser pipes 14. Condensation holes 10a, 10b are formed between riser pipes 14 and separated from the flow path of the material to be heated. As shown in FIG. 2, condensation holes 10a adjacent to each other are formed on the opposite sides respectively of riser pipe 14 to sandwich riser pipe 14, and condensation holes 10b adjacent to each other are formed on the opposite sides respectively of riser pipe 14 to sandwich riser pipe 14. Main header pipe 12 and branch header pipes 13 are arranged between condensation holes 10b and condensation pits 16 so that the pipes are sandwiched between condensation holes 10b and condensation pits 16.

An operation of the heat equalizer will now be described. In the heat equalizer of the first embodiment configured in the above-described manner, heating means 6 installed under heating block 1 generates heat and thereby heats heating block 1. As heating block 1 is heated, working fluid 5 is heated that is retained in the working fluid retaining portion at the bottom of the container structure, namely retained in the bottom portion of hollow portion 4 formed between heating block 1 and housing 2 and in the lower portion of condensation pits 16 formed in the lower portion of heating block 1.

As working fluid 5 is heated to be evaporated, vapor bubbles 7 are generated in working fluid 5. A part of the working fluid that has been heated to be evaporated into the gaseous state by heating means 6 moves from the liquid surface of working fluid 5 into condensation holes 10a, 10b as indicated by broken-line arrow 8. The gaseous working fluid having moved into condensation holes 10a, 10b transfers heat to the inner wall surface of condensation holes 10a, 10b, and is accordingly cooled and condensed into the liquid state. The working fluid having been condensed into the liquid state spontaneously flows back to the working fluid retaining portion at the bottom of the container structure as indicated by solid-line arrow 9.

Further, a part of the gaseous working fluid moves from the liquid surface of working fluid 5 into condensation pit 16 as indicated by arrow 8. The gaseous working fluid having moved into condensation pit 16 heats the inner wall surface of condensation pit 16, particularly the upper surface that is the deepest portion of condensation pit 16, and is accordingly cooled and condensed into the liquid state. The working fluid having been condensed into the liquid state also spontaneously flows back to the working fluid retaining portion at the bottom of the container structure as indicated by arrow 9.

In this way, the inner surfaces of condensation holes 10a, 10b and condensation pits 16 provided in heating block 1 are heated through the evaporation and condensation of the working fluid.

As for the material to be heated that is a predetermined material, the material proceeds as indicated by an open arrow 17 from the outside of the container structure through material feed pipe 11 to heating block 1, and is successively conveyed by pressure to riser pipes 14 through main header pipe 12 and then branch header pipes 13 formed in heating block 1. While passing in heating block 1, the material to be heated is heated from the wall surfaces of condensation holes 10a, 10b and condensation pits 16 provided in heating block 1. Namely, the material to be heated that is supplied through material feed pipe 11 into heating block 1 is heated through heat exchange with working fluid 5 heated to be evaporated into the gaseous state by heating means 6.

At this time, main header pipe 12 and branch header pipes 13 are arranged between condensation holes 10b and condensation pits 16. While the material to be heated flows in main header pipe 12 and branch header pipes 13, heat is transferred to the material from condensation holes 10b formed on the upper side. At the same time, heat is transferred to the material to be heated, from condensation pits 16 formed under main header pipe 12 and branch header pipes 13 and provided in the entire region in the longitudinal directions of main header pipe 12 and branch header pipes 13. Riser pipe 14 is formed between two condensation holes 10a adjacent to each other and between two condensation holes 10b adjacent to each other. While the material to be heated flows in riser pipe 14, heat is transferred to the material from condensation holes 10a, 10b formed on both of the right and left sides.

To the material to be heated that flows in the flow path formed in heating block 1, heat is transferred from two condensation paths formed to sandwich the flow path. The material to be heated that is flowing in the flow path is heated from two directions opposite to each other. Because the material to be heated is heated from multiple directions, generation of a temperature difference in the material to be heated that flows in the flow path is suppressed. Namely, the uniformity of the temperature of the material to be heated can be improved.

The inner diameters of main header pipe 12, branch header pipe 13, and riser pipe 14 are each selected so that the flow rate of the material to be heated in main header pipe 12 is sufficiently lower than the flow rate of the material to be heated in branch header pipe 13 and so that the flow rate of the material to be heated in branch header pipe 13 is sufficiently lower than the flow rate of the material to be heated in riser pipe 14. Therefore, the material to be heated that flows out of main header pipe 12 equally enters a plurality of branch header pipes 13 and likewise equally enters a plurality of riser pipes 14. Namely, the material to be heated moves in a constant flow state through a predetermined flow path, and therefore, it does not occur that the material to be heated stays at a specific part in the flow path to cause respective temperature histories at respective positions in the flow path to be different from each other. Accordingly the temperature history of the material to be heated can be equalized and the temperature uniformity of the material after heated can be improved.

When riser pipe 14 is formed of a pipe having a small inner diameter of approximately 2 to 3 mm, convection of the melt of the material to be heated does not occur in riser pipe 14, and no temperature unevenness is generated in the material to be heated in riser pipe 14. Therefore, the temperature of the material to be heated can be further equalized.

In heating block 1, when the material to be heated is heated to a temperature close to the boiling point, the material to be heated is evaporated into the gaseous state. The gaseous material to be heated flows through opening 15 to the outside of heating block 1. Thus, the gaseous material to be heated that has a suppressed temperature distribution and an equalized temperature can be obtained.

In the lower portion of heating block 1, a column 18 is formed by condensation pit 16 formed in the lower portion of heating block 1, and the heat equalizer is structured to be able to sufficiently endure generation of the vapor pressure in the container structure due to evaporation of working fluid 5. This column 18 causes heat conduction from heating means 6 to the upper portion of heating block 1. The heat generated by heating means 6 also causes working fluid 5 to be evaporated in condensation pit 16 around column 18 formed in the lower portion of heating block 1, while the heat is transferred to the upper portion of heating block 1. Condensation pit 16 and column 18 are designed so that the temperature of the upper portion of column 18, namely the temperature of the flow path of the material to be heated, is lowered to a temperature which is almost equal to the temperature of the working fluid at the upper surface of condensation pit 16.

As heretofore described, the heat equalizer in the first embodiment includes the container structure, heating means 6, and material feed pipe 11. In the container structure, hollow portion 4 in which the working fluid is held is formed. The container structure has heating block 1 in which the material to be heated is heated to be vaporized, and housing 2 surrounding heating block 1. Heating means 6 is placed at the bottom of heating block 1. Material feed pipe 11 allows the outside and the inside of the container structure to communicate with each other.

In heating block 1, a flow path in which the material to be heated flows is formed. The flow path includes main header pipe 12 that is connected to material feed pipe 11 and extends in the horizontal direction to serve as a first flow path, riser pipe 14 branching from the first flow path and extending in the vertical direction to serve as a second flow path, and opening 15 formed by the second flow path opening at the upper surface of heating block 1.

In heating block 1, the condensation path is formed. In the condensation path, the working fluid heated to be evaporated by heating means 6 is cooled to be condensed. The condensation path includes condensation holes 10a, 10b formed on the opposite sides respectively of riser pipe 14 and extending in the horizontal direction to serve as upper condensation holes, and condensation pit 16 formed under riser pipe 14 to serve as lower condensation pit. Between condensation hole 10b and condensation pit 16, main header pipe 12 is placed.

In this way, condensation of the working fluid on the inner wall surfaces of condensation holes 10a, 10b and condensation pit 16 provided in heating block 1 causes heating block 1 to be heated, and the uniformity in temperature of heating block 1 having been heated is improved. Therefore, the temperature after heating of the material that has been heated while passing in the flow path in heating block 1 can be equalized. Further, the flow path is formed so that the material to be heated continuously flows to opening 15 from the connecting portion between material feed pipe 11 and main header pipe 12. The material to be heated is not partially retained at a part of the flow path, and the uniformity of the heating history of the material to be heated can be improved. Further, because riser pipe 14 has a small diameter, convection of the melt of the material to be heated that passes in riser pipe 14 can be suppressed, and the temperature uniformity of the material having been heated and vaporized can be further improved.

Condensation pits 16 that are lower condensation pits are provided in the entire region in the longitudinal directions of main header pipe 12 and branch header pipes 13. In this way, in the entire region in the longitudinal directions of main header pipe 12 and branch header pipes 13, heat can be transferred to the material to be heated, from upper condensation holes 10a, 10b and also from lower condensation pits 16. Thus, the temperature uniformity of the material to be heated can further be improved.

Therefore, the heat equalizer in the first embodiment can manage the temperature of the inner wall surface of the flow path for heating the material to be heated, so that the distribution of the temperature is within ±1° C., and the amount of vaporization of the material to be heated can be controlled with high precision. Thus, an evaporation source applicable to a vapor deposition apparatus forming a film with high precision can be obtained.

Further, the material to be heated is spread and heated in main header pipe 12, branch header pipes 13, and riser pipes 14 that are a number of small-diameter holes formed in heating block 1. Thus, the area of the heat transfer surface is increased and the material to be heated can be heated over the large surface area. Therefore, the heating efficiency is enhanced and the thermal response when the temperature is increased is considerably improved. In addition, the thermal energy for increasing the temperature can be minimized. Thus, the heat equalizer with improved heat transfer efficiency and suitable for energy saving can be obtained.

Figure 16:
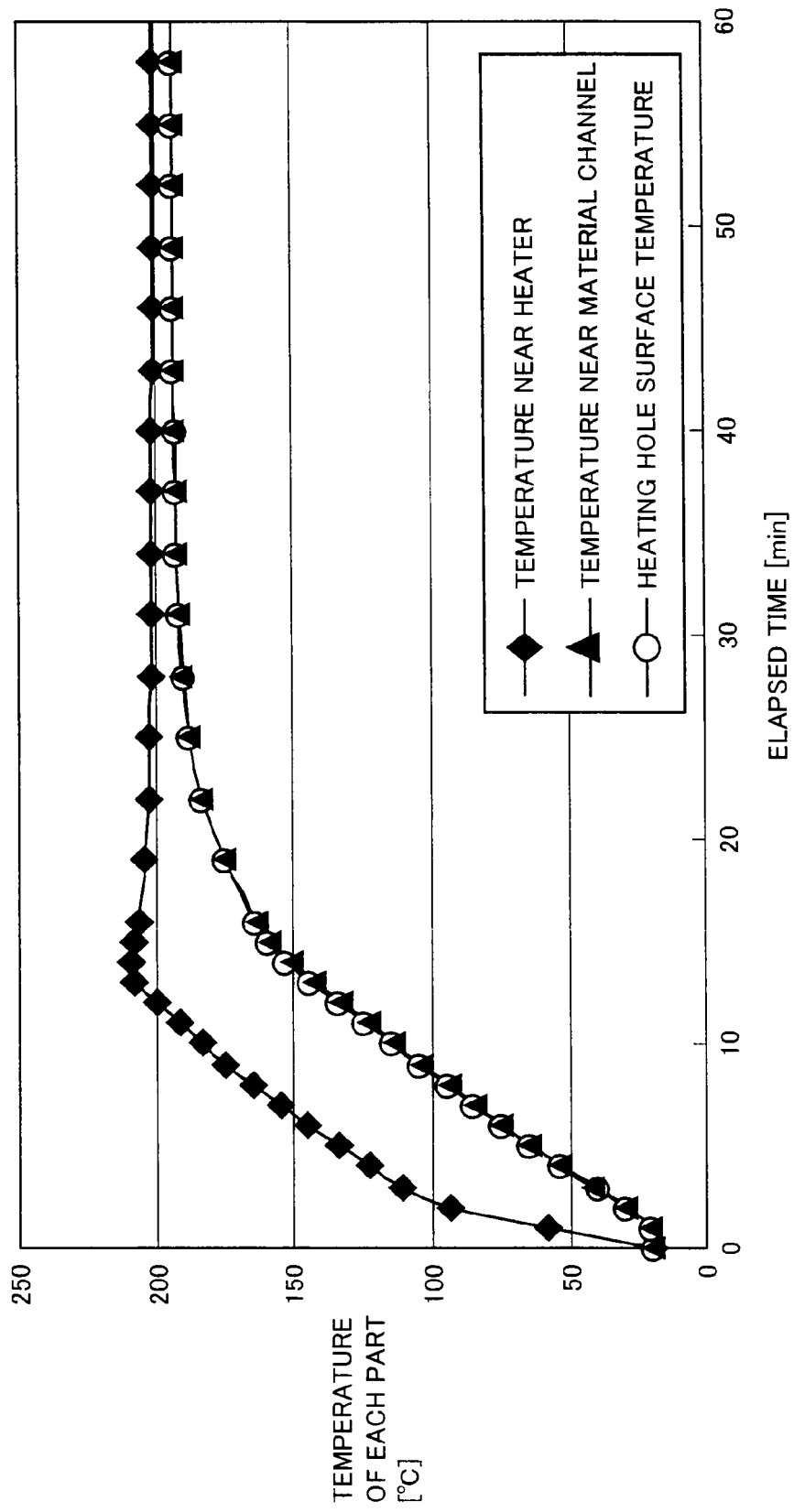
FIG. 16 is a graph showing the result of measurement of the temperature at each part of the heat equalizer of the first embodiment in a temperature-increasing process.

The heat-equalizing heating effect of the heat equalizer in the first embodiment as heretofore described has been confirmed through temperature measurement in the process in which the heat equalizer increases the temperature. FIG. 16 is a graph showing the result of measurement of the temperature at each part of the heat equalizer in the temperature-increasing process of the heat equalizer in the first embodiment. In FIG. 16, the horizontal axis represents time (in minutes) elapsed from the time when increase of the temperature is started, and the vertical axis represents temperature (in ° C.). FIG. 16 shows curves representing temperature increases in the vicinity of heating means 6, in the vicinity of branch header pipe 13, and at opening 15 in the case where water is used as working fluid 5 in the first embodiment.

As shown in FIG. 16, the temperature in the vicinity of heating means 6 (near-heater temperature) is higher than the temperatures at other portions. In contrast, the temperature increase of opening 15 at the upper surface of heating block 1 that is the outlet portion of the material to be heated (heating hole surface temperature), and the temperature increase in the vicinity of branch header pipe 13 that is a flow path for the material to be heated (near-material-channel temperature) are substantially identical to each other. Namely, it is seen that the material to be heated has its temperature increasing while keeping the state where the temperature is extremely equalized.

Further, the temperature controllability in the process to reach a stable temperature is excellent, and the effectiveness of the configuration of the heat equalizer in the first embodiment has been confirmed. In this example, the temperature distribution in a normal state at opening 15 was not more than ±0.5° C. In the example shown in FIG. 16, it takes approximately 0.5 hour for normal temperature to increase to approximately 200° C., which exhibits a short-term temperature increase property.

Second Embodiment

Figure 4:
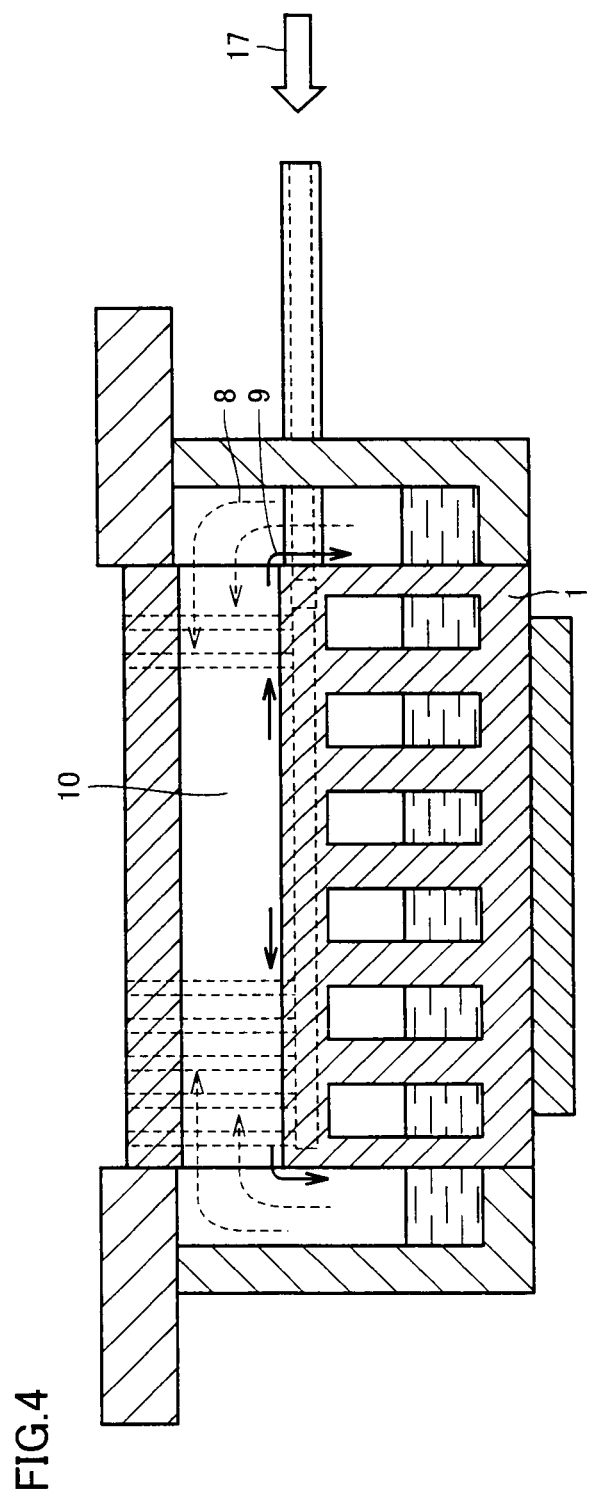
FIG. 4 is a cross section of a heat equalizer in a second embodiment.
Figure 5:
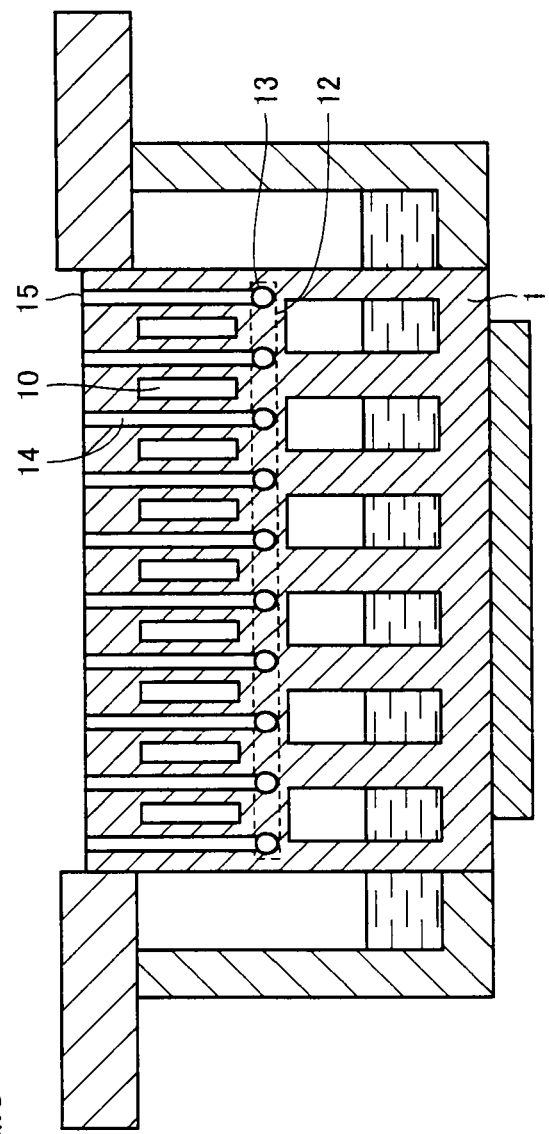
FIG. 5 is a cross section of the heat equalizer orthogonal to the cross section shown in FIG. 4.

FIG. 4 is a cross section of a heat equalizer in a second embodiment. FIG. 5 is a cross section of the heat equalizer that is orthogonal to the cross section shown in FIG. 4. The heat equalizer in the second embodiment differs from the heat equalizer in the first embodiment in that the upper condensation hole is configured in the manner as shown in FIGS. 4 and 5.

Specifically, while the first embodiment has been described in connection with the example where condensation holes 10a, 10b in the upper portion of heating block 1 are formed as circular holes, condensation hole 10 serving as an upper condensation hole may alternatively have a cross section of a vertically long rectangular shape (namely the longer sides extend in the vertical direction) as shown in FIGS. 4 and 5. In this case, the liquid working fluid that has been cooled and condensed in condensation hole 10 gathers, because of a capillary force, at a corner portion near the apex of the oblong cross section of condensation hole 10. Therefore, the inside of condensation hole 10 can be prevented from being clogged with the liquid working fluid, and a space for the vapor of the working fluid is surely left. Further, the thickness of a layer of the liquid working fluid attached to the planar portion of condensation hole 10 can be reduced, and therefore, the surface temperature distribution of condensation hole 10 is improved.

Further, as shown in FIG. 5, condensation hole 10 is configured to extend along riser pipe 14. Condensation hole 10 extends along the direction in which riser pipe 14 extends. In this way, the heat transfer distance from the surface of condensation hole 10 to riser pipe 14 in which the material to be heated flows can be made uniform along the direction in which riser pipe 14 extends. Therefore, the material to be heated that flows in riser pipe 14 can be heated in the region from the lower end of riser pipe 14 to opening 15 so that the temperature is further equalized.

Furthermore, because condensation hole 10 has the vertically-long rectangular shape in cross section, the intervals at which riser pipes 14 are arranged can be reduced. Therefore, as compared with the case where the condensation holes are circular holes as shown in FIG. 2, the number of riser pipes 14 can be increased as shown in FIG. 5, and accordingly the opening area of riser pipes 14 can be increased. Thus, the efficiency of evaporation of the material to be heated can be improved. In the case where the total surface area of riser pipes 14 is constant, the cross-sectional shape of condensation hole 10 can be changed from the circular shape to the rectangular shape to decrease the size in the width direction of heating block 1 and accordingly downsize the heat equalizer. In this way, the heat equalizer allowed to have an improved thermal response and an energy saving structure with a reduced heat dissipation surface area can be obtained.

For example, in the case where the working fluid is water, it is necessary that the diameter of condensation hole 10 which is a circular hole is approximately 7 to 8 mm. In contrast, in the case where the condensation hole has a vertically-long rectangular cross-sectional shape, the dimension of the width (namely the dimension of the shorter side of condensation hole 10) can be decreased to approximately 3 to 4 mm. Therefore, the pitch of riser pipes 14 can be reduced by approximately 30%.

Third Embodiment

Figure 6:
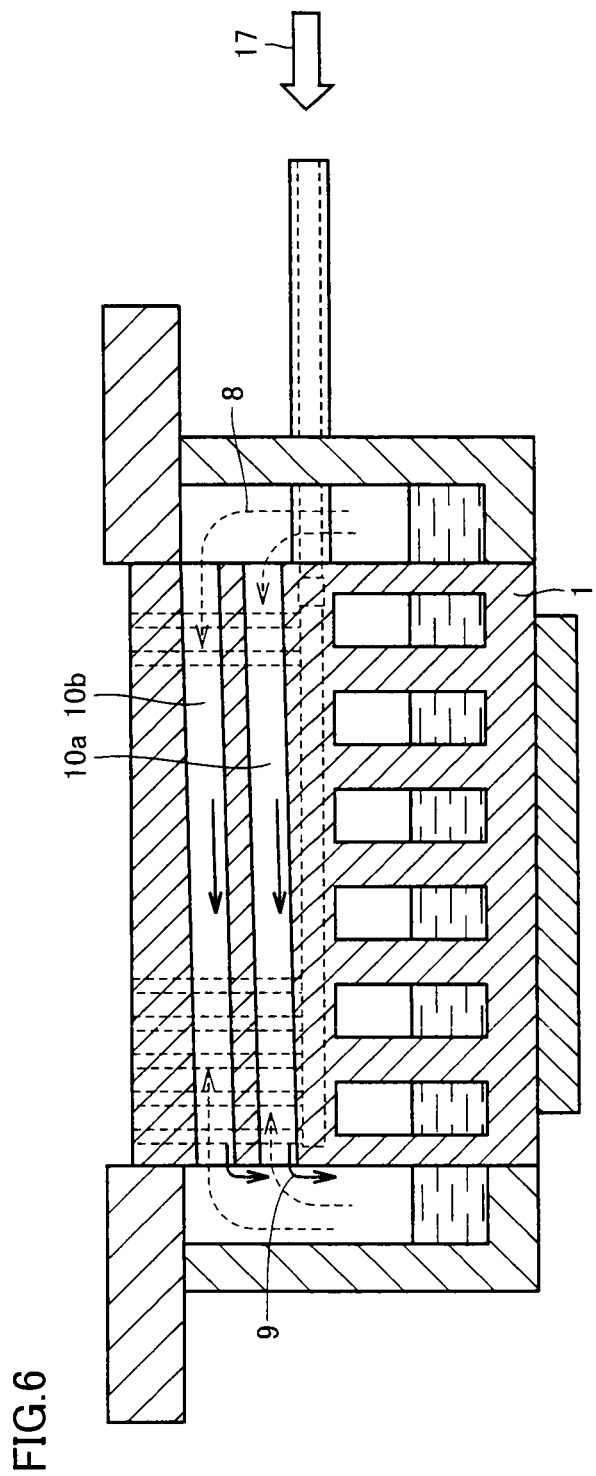
FIG. 6 is a cross section of a heat equalizer in a third embodiment.
Figure 7:
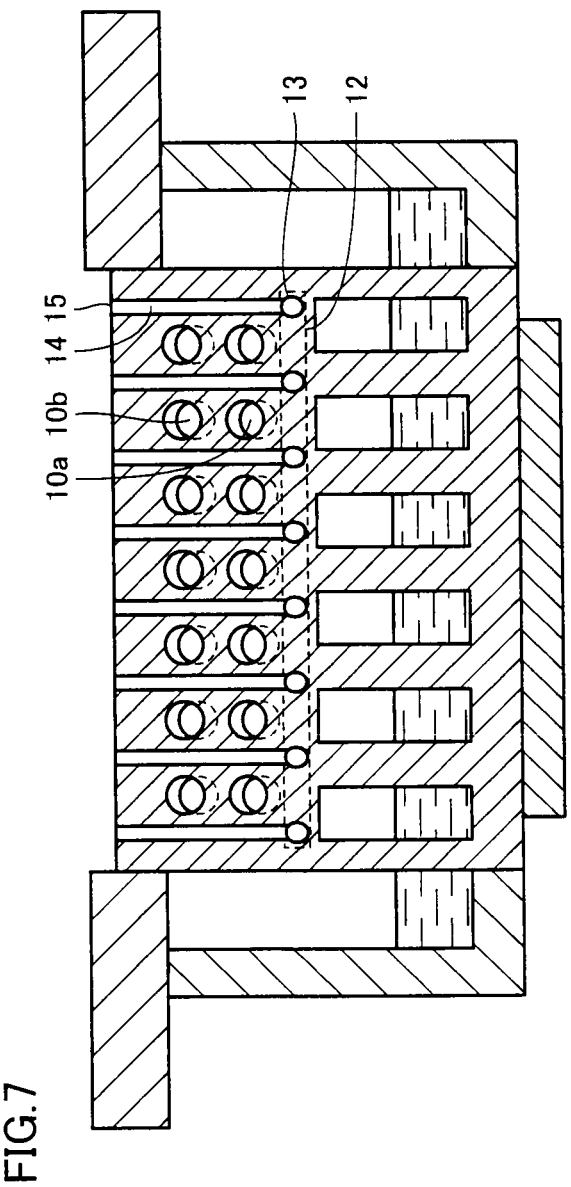
FIG. 7 is a cross section of the heat equalizer orthogonal to the cross section shown in FIG. 6.

FIG. 6 is a cross section of a heat equalizer in a third embodiment. FIG. 7 is a cross section of the heat equalizer that is orthogonal to the cross section shown in FIG. 6. The heat equalizer in the third embodiment differs from the heat equalizer in the first embodiment in that the upper condensation holes are configured in the manner as shown in FIGS. 6 and 7.

Specifically, the first embodiment has been described in connection with the example where condensation holes 10*a*, 10*b* in the upper portion of heating block 1 extend in the horizontal direction. In contrast, as shown in FIGS. 6 and 7, one side of condensation holes 10*a*, 10*b* serving as upper condensation holes may be relatively higher and the other side thereof may be relatively lower in the depth direction, so that the condensation holes are inclined holes that are inclined in the depth direction with respect to the horizontal direction.

Thus, the liquid working fluid having been cooled and condensed through heat exchange with the material to be heated flows along the inclined bottom surfaces of condensation holes 10*a*, 10*b*. Therefore, the liquid working fluid can spontaneously flow immediately from condensation holes 10*a*, 10*b* to the working fluid retaining portion at the bottom of the container structure. Accordingly, a film of the liquid working fluid retained on the inner surface of condensation holes 10*a*, 10*b* can be further made thinner, and the temperature over the entire surface of condensation holes 10*a*, 10*b* can be further equalized. The temperature of the material to be heated flowing in riser pipe 14 can therefore be equalized to a further extent.

Figure 8:
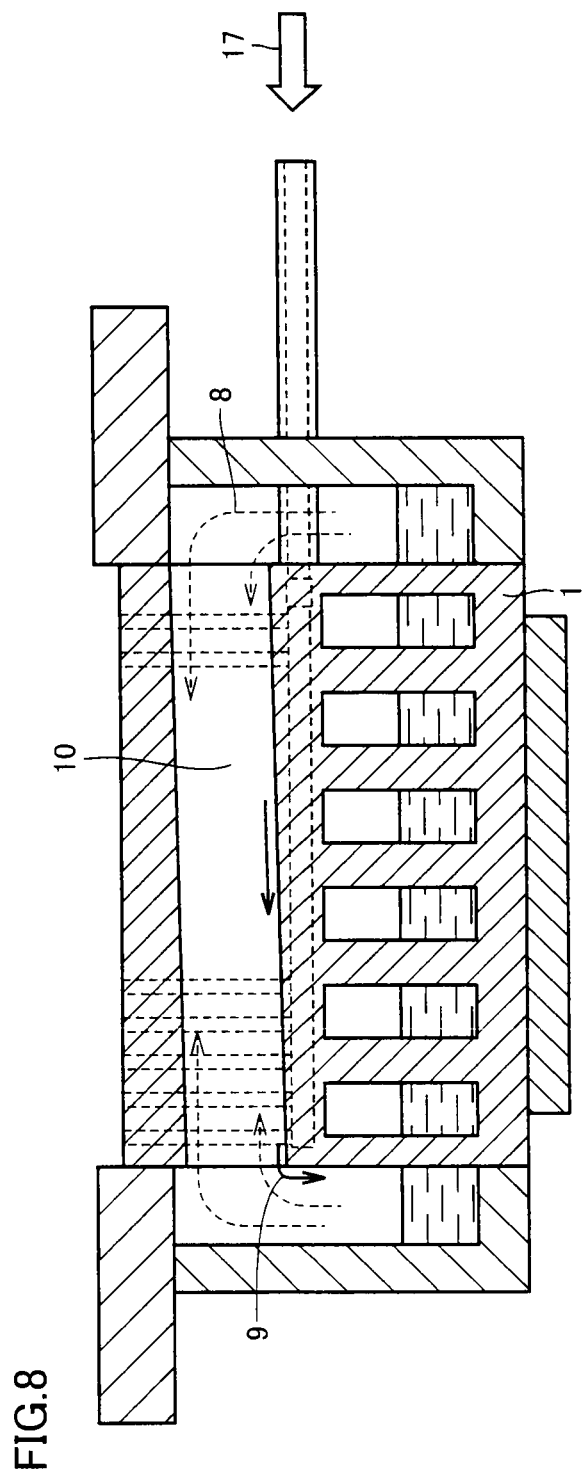
FIG. 8 is a cross section of a modification of the heat equalizer in the third embodiment.
Figure 9:
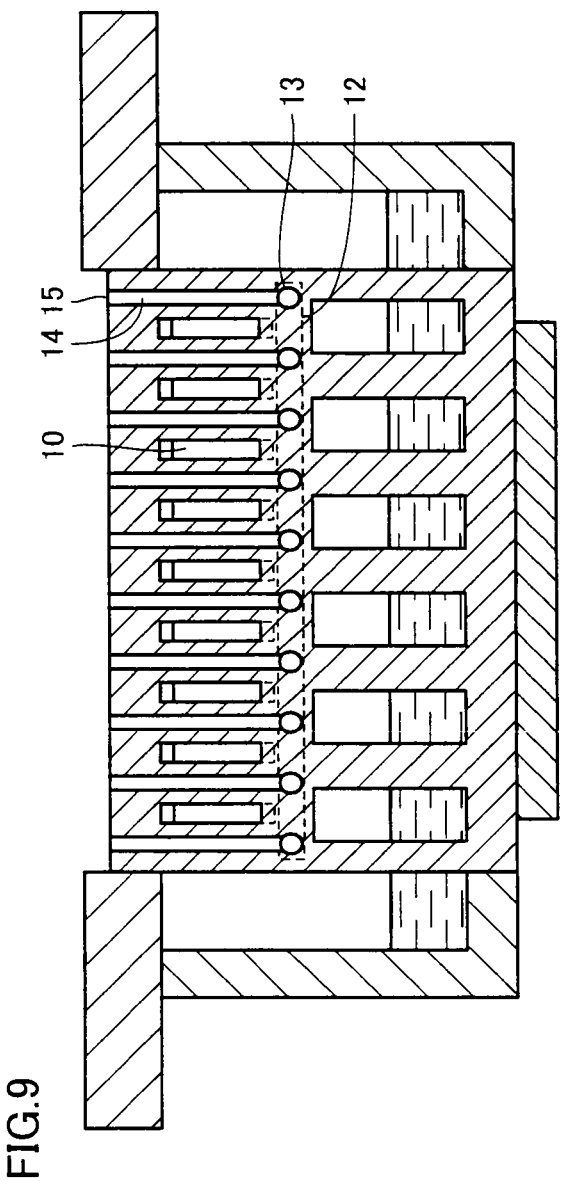
FIG. 9 is a cross section of the heat equalizer orthogonal to the cross section shown in FIG. 8.

FIG. 8 is a cross section of a modification of the heat equalizer in the third embodiment. FIG. 9 is a cross section of the heat equalizer that is orthogonal to the cross section shown in FIG. 8. As shown in FIGS. 8 and 9, one side of condensation hole 10 having a vertically-long rectangular cross section is made relatively higher in the depth direction and the other side thereof is made relatively lower in the depth direction, so that the hole is formed as an inclined hole that is inclined in the depth direction with respect to the horizontal direction. In this way as well, the effects similar to the above-described ones can be obtained.

Fourth Embodiment

Figure 10:
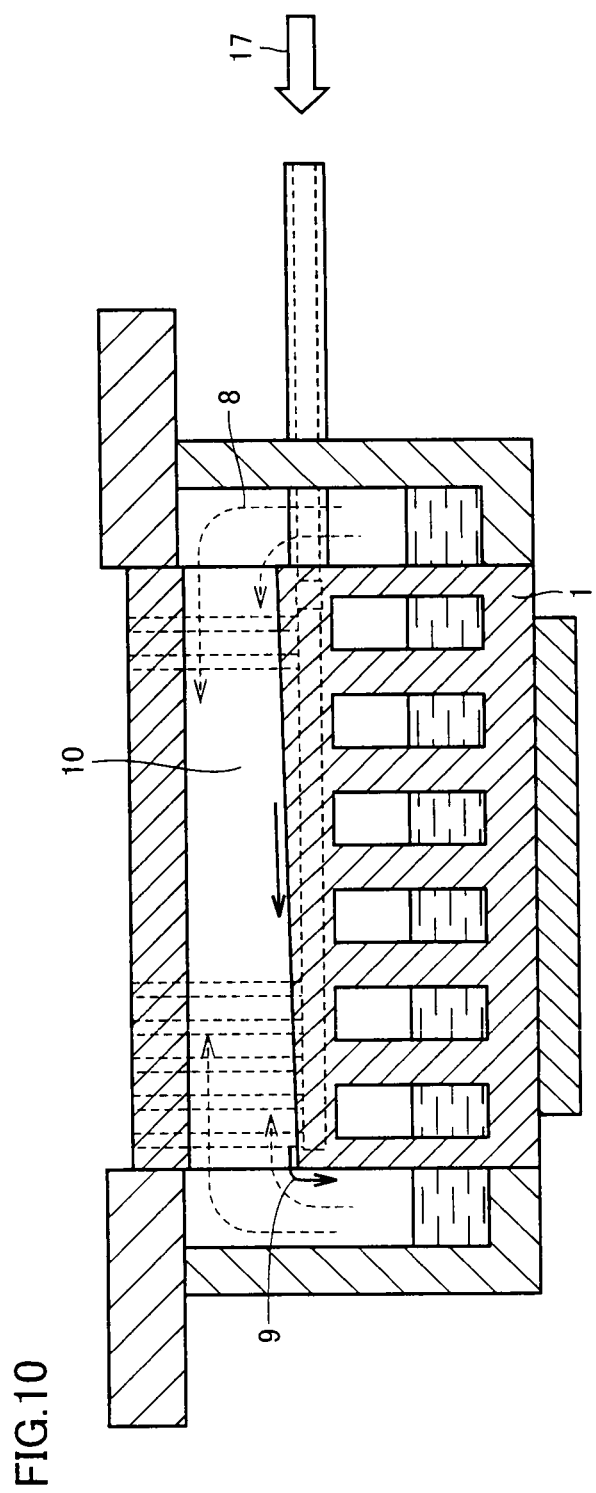
FIG. 10 is a cross section of a heat equalizer in a fourth embodiment.
Figure 11:
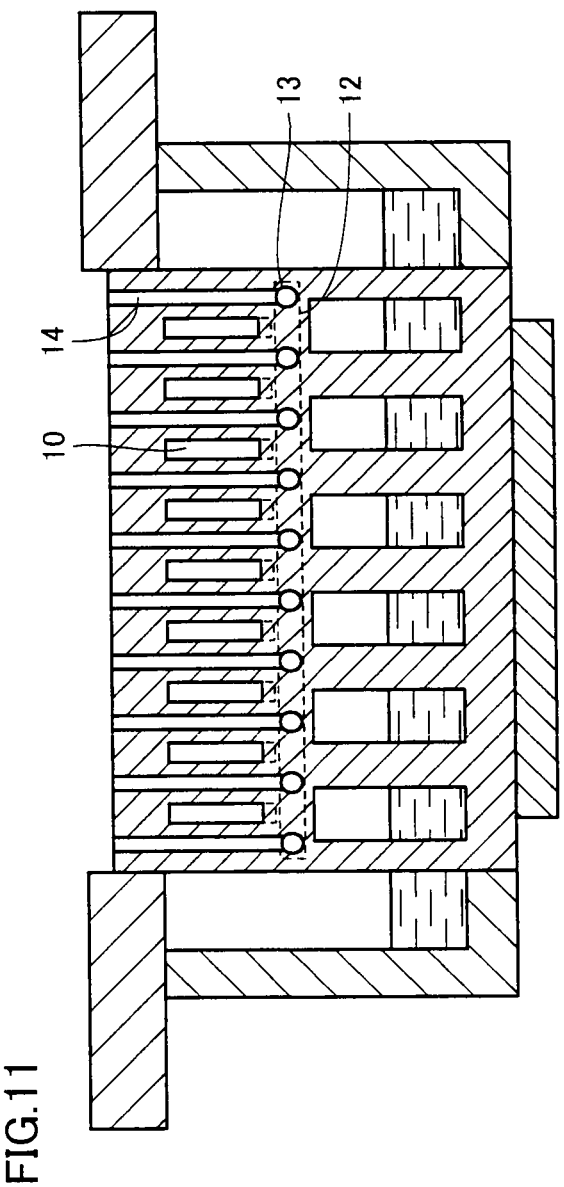
FIG. 11 is a cross section of the heat equalizer orthogonal to the cross section shown in FIG. 10.

FIG. 10 is a cross section of a heat equalizer in a fourth embodiment. FIG. 11 is a cross section of the heat equalizer that is orthogonal to the cross section shown in FIG. 10. The heat equalizer in the fourth embodiment differs from the heat equalizer in the third embodiment in that the upper condensation hole is configured in the manner as shown in FIGS. 10 and 11.

Specifically, while the third embodiment is described above in connection with the condensation hole in the upper portion of heating block 1 that has a uniform cross section and is inclined, condensation hole 10 may have a horizontal upper surface and an inclined bottom surface as shown in FIGS. 10 and 11. Namely, the upper side of condensation hole 10 extends in the horizontal direction while the lower side of condensation hole 10 is inclined in the depth direction. The bottom surface of condensation hole 10 is inclined, and thus the liquid working fluid having been condensed into the liquid state in condensation hole 10 is returned to the working fluid retaining portion at the bottom of the container structure.

In this way, the liquid working fluid gathering at the bottom of condensation hole 10 can be efficiently removed to the outside of condensation hole 10, and the film of the liquid working fluid can be made thinner. Further, the material to be heated can be heated in each of a plurality of riser pipes 14 to an area near opening 15. The heat-equalizing heating effect for the material to be heated can thus be further improved.

Fifth Embodiment

Figure 12:
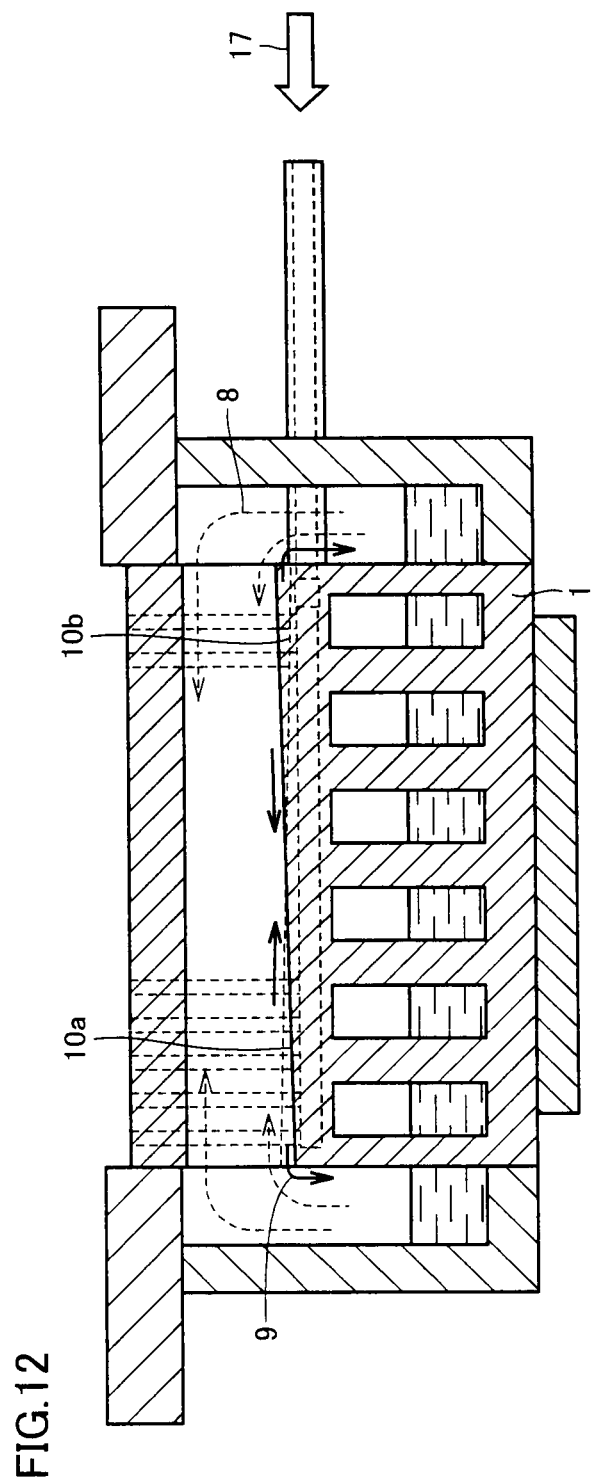
FIG. 12 is a cross section of a heat equalizer in a fifth embodiment.
Figure 13:
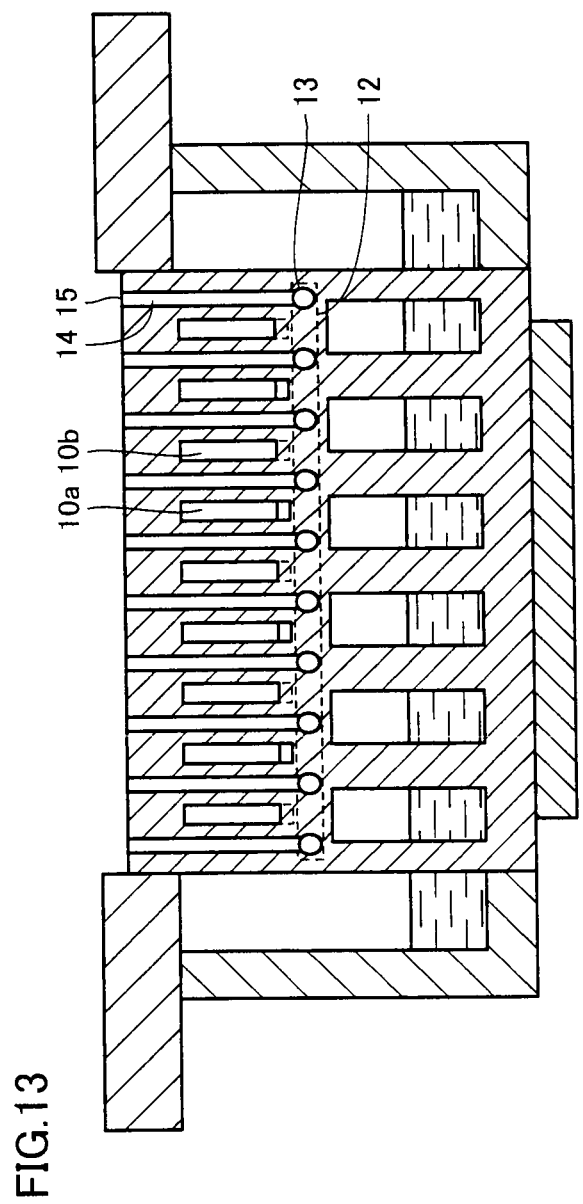
FIG. 13 is a cross section of the heat equalizer orthogonal to the cross section shown in FIG. 12.

FIG. 12 is a cross section of a heat equalizer in a fifth embodiment. FIG. 13 is a cross section of the heat equalizer that is orthogonal to the cross section shown in FIG. 12. The heat equalizer in the fifth embodiment differs from the heat equalizer in the fourth embodiment in that the upper condensation hole is configured in the manner as shown in FIGS. 12 and 13.

Specifically, while the fourth embodiment has been described in connection with the condensation holes that have respective inclined bottom surfaces all inclined in the same direction, condensation holes 10*a*, 10*b* may be inclined in different directions respectively as shown in FIGS. 12 and 13. Namely, the polarity of the angle, with respect to the horizontal direction, formed by the bottom surface of condensation hole 10*a* inclined in the depth direction, and the polarity of the angle, with respect to the horizontal direction, formed by the bottom surface of condensation hole 10*b* inclined in the depth direction, are opposite to each other. Consequently, respective portions, located on the opposite sides of riser pipe 14, of condensation holes 10*a*, 10*b*, are displaced in the vertical direction.

In this way, the positions of the bottom sides of condensation holes 10*a*, 10*b* can be averaged with respect to riser pipes 14, and the material to be heated that flows in riser pipe 14 can be uniformly heated in each riser pipe 14 over the region from the lower end of riser pipe 14 to opening 15. The material to be heated therefore can be heated more uniformly.

Sixth Embodiment

Figure 14:
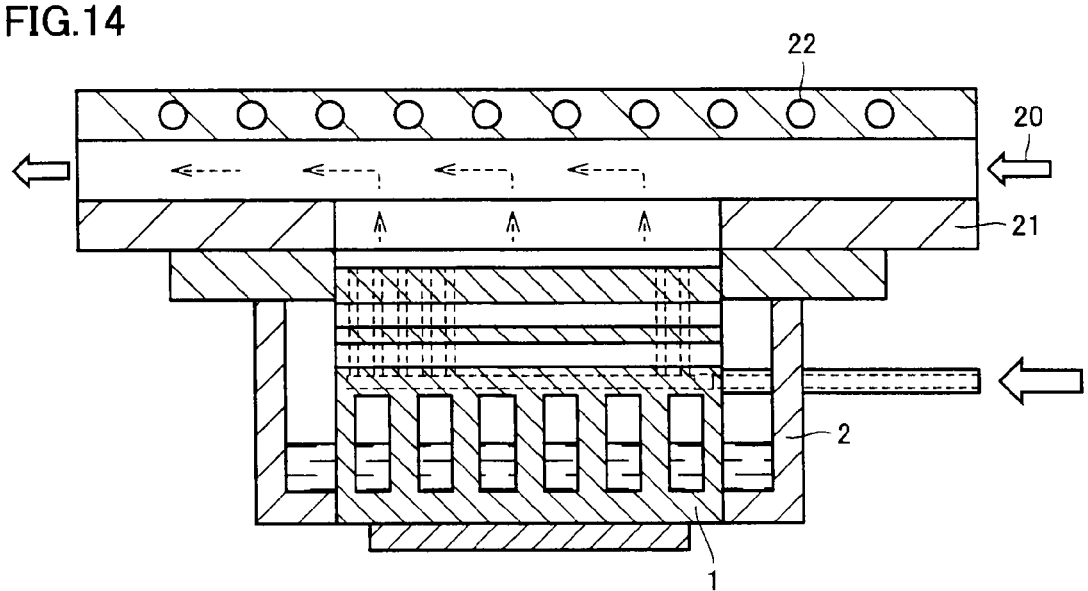
FIG. 14 is a cross section of a heat equalizer in a sixth embodiment.
Figure 15:
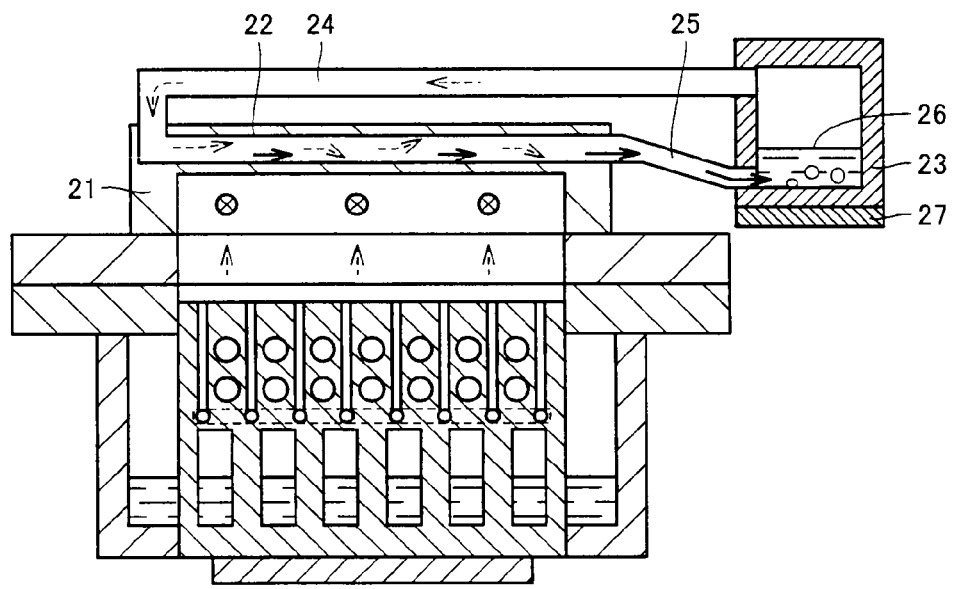
FIG. 15 is a cross section of the heat equalizer orthogonal to the cross section shown in FIG. 14.

FIG. 14 is a cross section of a heat equalizer in a sixth embodiment. FIG. 15 is a cross section of the heat equalizer that is orthogonal to the cross section shown in FIG. 14. FIGS. 14 and 15 show the heat equalizer in which a pipe system 21 is placed for supplying, to a process container, a material to be heated having been evaporated into the gaseous state. A part of the lower portion of pipe system 21 is opened to be coupled to opening 15 opened at the upper surface of the container structure. A carrier gas flows in pipe system 21 as indicated by an open arrow 20.

In the case where the surface temperature of the inner wall surface of pipe system 21 is lower than the temperature of heating block 1, the material to be heated having been heated in heating block 1 is condensed to be attached to the inner surface of pipe system 21. The sixth embodiment therefore aims to uniformly heat pipe system 21 as well. Specifically, the heat equalizer of the sixth embodiment further includes pipe system 21 coupled to opening 15 and heating equipment for heating pipe system 21.

Referring to FIGS. 14 and 15, an example of the heating equipment will be described. At a wall surface of pipe system 21, a condensation pit 22 is arranged. On the outside of and at a lower level than pipe system 21, an evaporator 23 is provided separately from pipe system 21. Pipe system 21 and evaporator 23 are allowed to communicate with each other by a vapor pipe 24 and a liquid pipe 25 so that a hollow channel is formed. In this hollow channel, a second working fluid 26 of a predetermined quantity is fed and held after evacuation. Under evaporator 23, second heating means 27 is provided.

Separately from heating means 6 described in connection with the first embodiment, second heating means 27 is provided, and therefore, the temperature of pipe system 21 and the temperature of the container structure are controlled separately from each other. The way to heat the inner surface of condensation pit 22 using second heating means 27 is similar to heating means 6, namely the wall surface of pipe system 21 is uniformly heated through evaporation and condensation of working fluid 26.

In this case, second heating means 27 can be used to maintain the inner wall surface of pipe system 21 at a temperature slightly higher than the temperature of the flow path in which the material to be heated flows in heating block 1. Thus, the material to be heated having been evaporated into the gaseous state can be prevented from being condensed into the liquid state (or condensed into the solid state) on the inner surface of pipe system 21. In the example shown in FIGS. 14 and 15, a plurality of circular pits are formed as condensation pits 22 provided in the wall of pipe system 21. This condensation pit 22 may be any as long as a hollow channel which communicates with evaporator 23 for the working fluid is formed. The cross-sectional shape of condensation pit 22 may therefore be circular, rectangular, or polygonal.

Seventh Embodiment

In the series of embodiments described above, the working fluid is evaporated and condensed in the container structure to transport heat from heating means 6 to heating block 1, and accordingly the material to be heated is heated. Naphthalene ($C_{10}H_8$) for example may be used as the working fluid. In this case, the catalytic effect of a stainless surface with which naphthalene is in contact causes naphthalene to be decomposed, and accordingly hydrogen is generated. When the hydrogen gas is present in the form of non-condensed gas on the surface where the gaseous working fluid is to be condensed, the hydrogen gas interferes with heat transfer caused by condensation of naphthalene vapor, which makes it difficult to keep a uniform temperature.

In a seventh embodiment, a passivation film containing a metal oxide is formed on the inner surface of the path in which the working fluid flows. In this way, decomposition of the working fluid due to the catalytic effect of a metal material, stainless steel for example, from which the heat equalizer is formed, is prevented from occurring.

An example will be illustrated below where the above-described decomposition behavior of the working fluid is examined. As an analyzer, an atmospheric pressure ionization mass spectroscopy (APIMS) was used. As a sample gas, vapor of naphthalene diluted with Ar gas to a concentration of 300 ppb was fed at a flow rate of 10 sccm to stainless pipes passivated in various manners respectively.

As for the shape of the stainless pipes, the outer diameter was 6.35 mm, the inner diameter was 4.35 mm, and the length was 1 m. As for the materials for the stainless pipes, a stainless pipe (SUS316L-EP) which is a pipe of SUS316 L specified by the JIS (Japan Industrial Standards) and treated by electrolytic polishing, a stainless pipe ($Cr_2O_3$-SUS) which is a pipe of SUS316L passivated with $Cr_2O_3$, a stainless pipe ($Al_2O_3$-SUS) which is a pipe of SUS316L passivated with $Al_2O_3$, and a stainless pipe ($Y_2O_3$-SUS) which is a pipe of SUS316L passivated with $Y_2O_3$ coating were prepared for use as samples. These samples of various stainless pipes were each placed directly before the APIMS analyzer, and naphthalene was fed while the temperature was increased at a rate of 4° C./min to 750° C.

Figure 17:
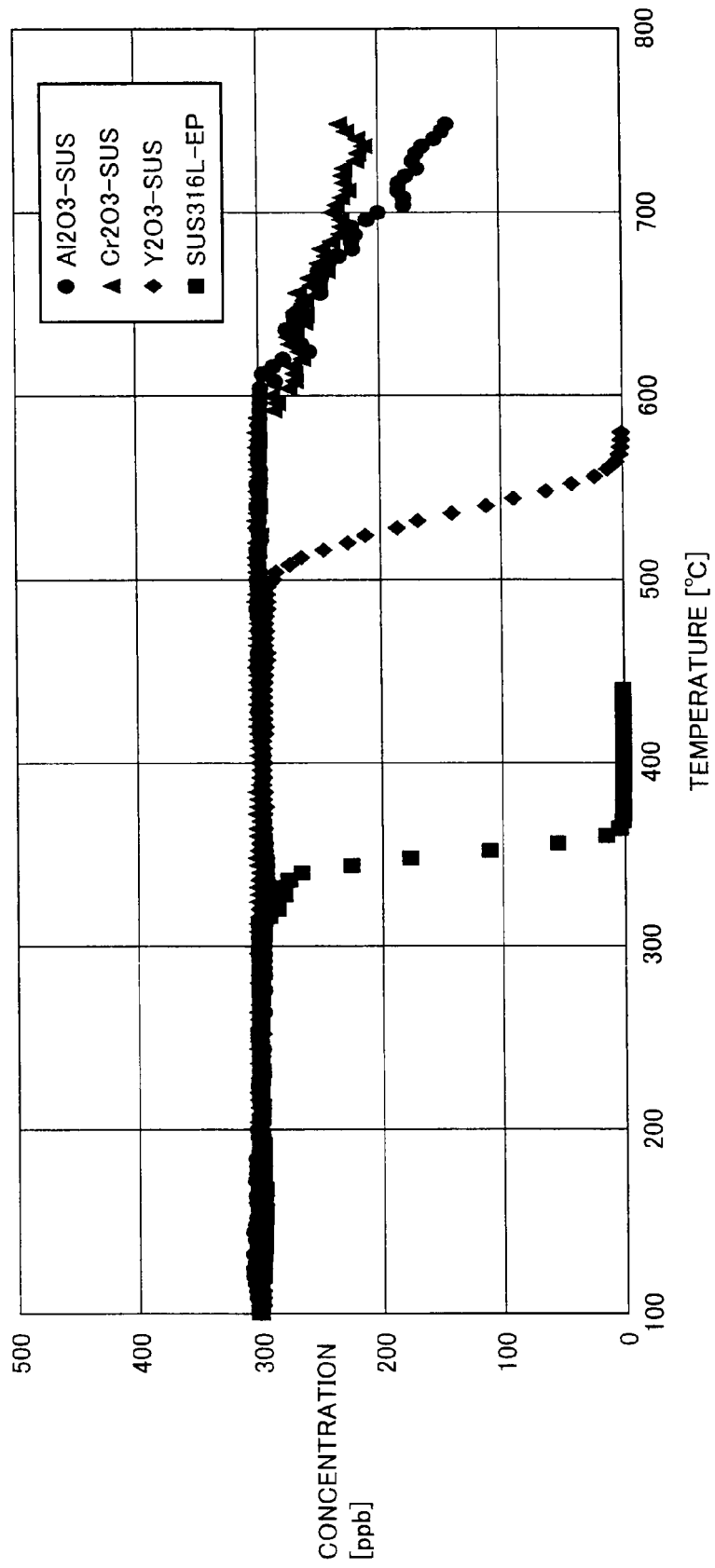
FIG. 17 is a graph showing thermal decomposition characteristics of naphthalene due to the catalytic effect of stainless steel.

FIG. 17 is a graph showing thermal decomposition characteristics of naphthalene due to the catalytic effect of stainless steel. In FIG. 17, the horizontal axis represents temperature (in ° C.) of the sample surface, and the vertical axis represents concentration (in ppb) of naphthalene. FIG. 17 shows a relation between the temperature and the naphthalene concentration at the surface of the passivation film of each sample. It was accordingly confirmed that, at the surface of the SUS316L-EP, decrease of the concentration due to decomposition of the naphthalene gas started from 312° C.

Then, at the surface of the $Y_2O_3$ coating passivation film, decomposition of naphthalene started from 500° C. At the surface of the $Cr_2O_3$ passivation film, decomposition of naphthalene started from 588° C. At the surface of the $Al_2O_3$ passivation film, decomposition of naphthalene started from 608° C. At still higher temperatures, the effect of suppressing decomposition was confirmed at the $Cr_2O_3$ passivation film surface.

As clearly seen from FIG. 17, in the case where the heat equalizer is operated using naphthalene as the working fluid in a temperature range of 350 to 450° C. and the surface of the heat equalizer with which the working fluid is brought into contact is a non-treated surface of stainless steel, the catalytic effect of the stainless surface causes thermal decomposition of the working fluid. In order to operate the heat equalizer stably, it is therefore a requisite condition to apply a surface passivation film of a metal oxide to the surface of the heat equalizer with which the working fluid is in contact. Preferred examples of such passivation may include, for example, $Y_2O_3$ coating passivation, $Al_2O_3$ passivation, and $Cr_2O_3$ passivation.

Eighth Embodiment

In the above-described series of embodiments, when a predetermined material to be heated flows in the flow path formed in heating block 1, heat is transferred from the inner wall surface of the flow path to heat the material. If the heated material is decomposed, it is difficult to supply the intended organic material of a predetermined concentration, and thus required performance cannot be achieved. An eighth embodiment therefore has a feature that, in order to prevent the material to be heated from being decomposed due to the catalytic effect of a metal material from which the flow path is formed, a passivation film containing a metal oxide is formed on the surface of the flow path in which the material to be heated flows.

An example will be illustrated below where the decomposition behavior of the material to be heated is examined. As an analyzer, an atmospheric pressure ionization mass spectroscopy (APIMS) was used similarly to the seventh embodiment. As a sample gas, vapor of decahydronaphthalene ($C_{10}H_{18}$) diluted with Ar gas to a concentration of 5 ppm was fed at a flow rate of 5 sccm to stainless pipes passivated in various manners respectively.

As for the shape of the stainless pipes, the outer diameter was 6.35 mm, the inner diameter was 4.35 mm, and the length was 1 m. As for the materials for the stainless pipes, a stainless pipe (SUS316L-EP) which is a pipe of SUS316 L specified by the JIS (Japan Industrial Standards) and treated by electrolytic polishing, a stainless pipe ($Al_2O_3$—SUS) which is a pipe of SUS316L passivated with $Al_2O_3$, and an Ni pipe were prepared for use as samples. These samples of various stainless pipes were each placed directly before an FTIR (Fourier Transform Infrared) analyzer, and decahydronaphthalene gas was fed while the temperature of various metal pipes was increased at a rate of 2° C./min to 800° C.

Figure 18:
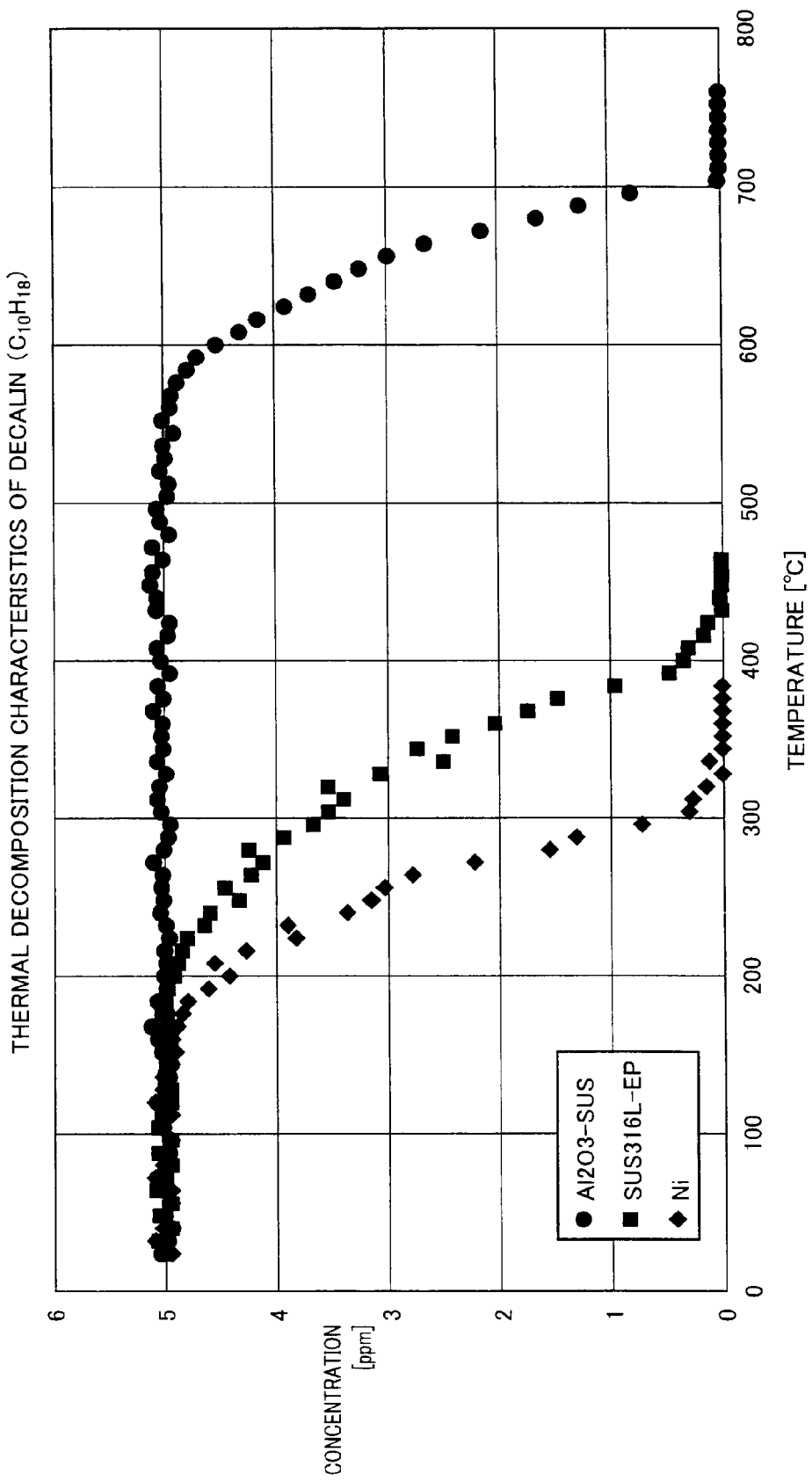
FIG. 18 is a graph showing thermal decomposition characteristics of decahydronaphthalene due to the catalytic effect of stainless steel.
Figure 19:
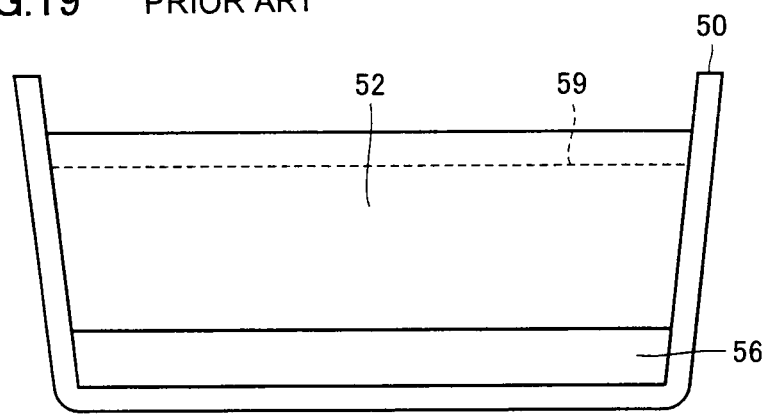
FIG. 19 is a side view of an evaporation container used for conventional heat treatment.
Figure 20:
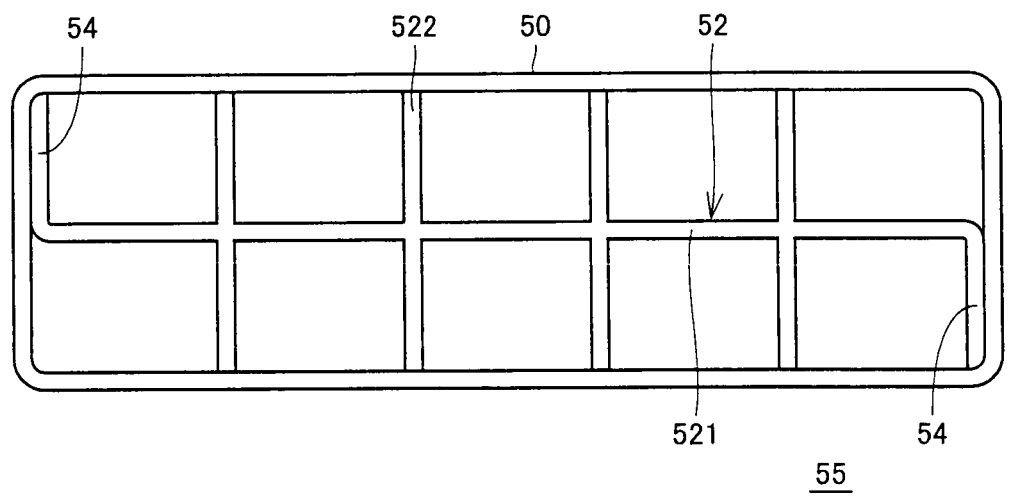
FIG. 20 is a plan view of the evaporation container used for conventional heat treatment.
Figure 21:
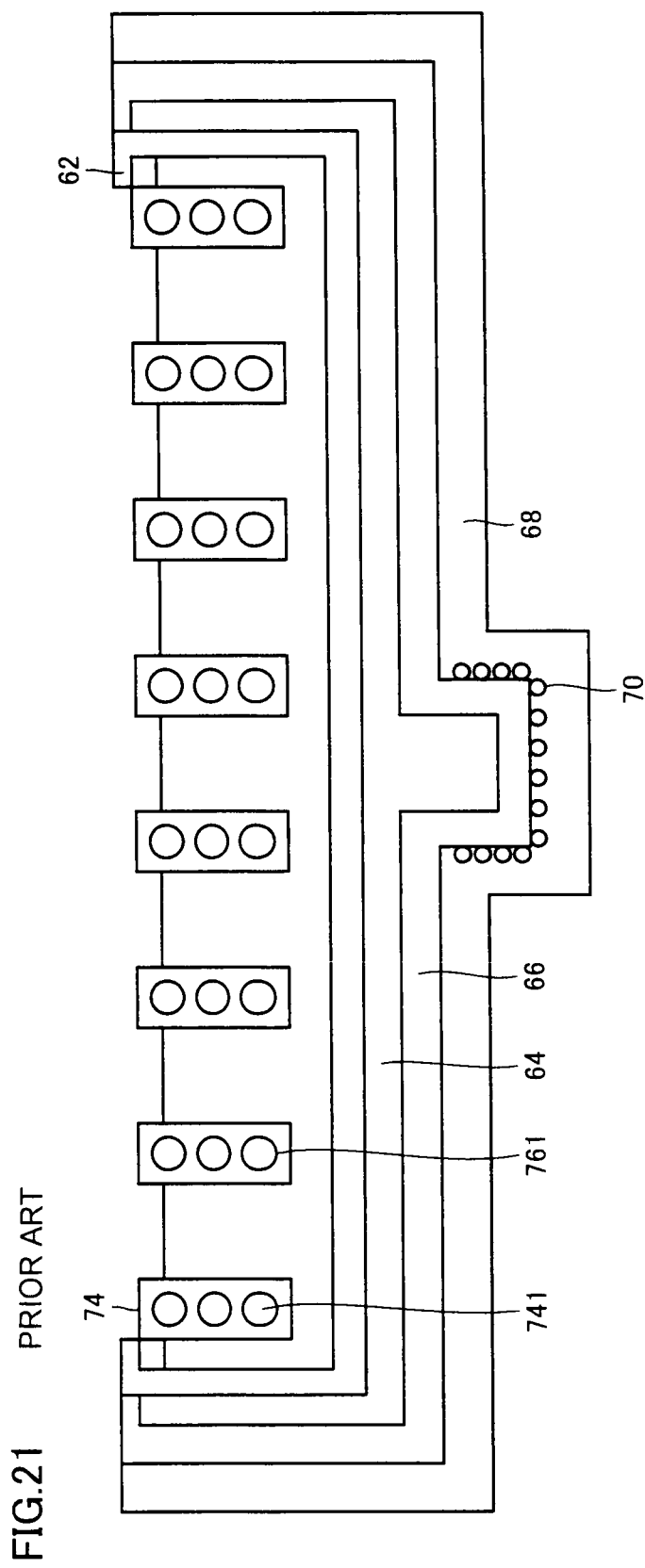
FIG. 21 is a schematic diagram showing a modification of a conventional partition plate.

FIG. 18 is a graph showing thermal decomposition characteristics of decahydronaphthalene due to the catalytic effect of stainless steel. In FIG. 18, the horizontal axis represents temperature (in ° C.) of the sample surface, and the vertical axis represents concentration (in ppm) of decahydronaphthalene. FIG. 18 shows thermal decomposition characteristics of decahydronaphthalene at the surface of the passivation film of each sample, that are measured for the sake of confirmation of a general thermal decomposition behavior of an organic material at a metal surface. It was confirmed that, at the Ni surface, decrease of the concentration due to decomposition of decahydronaphthalene gas started from 150° C. Further, at the surface of the SUS316L-EP, decomposition of decahydronaphthalene started from 200° C. In contrast, at the surface of the $Al_2O_3$ passivation film, decahydronaphthalene can be supplied stably without decomposition, to a temperature of 550° C.

In order to supply an organic material of a predetermined concentration, it is necessary to increase the temperature of the vaporization container. It is clearly seen from FIG. 18, however, the catalytic effect which is peculiar to the metal causes the organic material itself to be decomposed at an ordinary stainless surface or Ni surface. Further, accumulation of reaction products and resultant clogging of the flow path in the vaporization container are factors that cause troubles.

It is therefore a particularly important technique to apply a surface passivation film of a metal oxide to the surface of the line in which an organic material is held, in order to stably vaporize and supply the organic material. While $Al_2O_3$ passivation is illustrated here as an example, other metal oxides such as $Cr_2O_3$ and $Y_2O_3$ may also be used.

While the series of embodiments above have been described in which housing 2 has a substantially quadrilateral cross-sectional shape surrounding the periphery of heating block 1, the shape of heating block 1 and housing 2, however, is not limited to the quadrilateral and may alternatively be any polygon or circle. Further, housing 2 may be separated into respective sections for respective sides of heating block 1, and respective upper ends and lower ends may be joined to the sidewalls of heating block 1 to form the container structure.

For heating means 6 and heating means 27, electrical heating, induction heating, hot water heating, or vapor heating or the like may be used. The heating system is not limited to a particular one.

In the example described above, material feed pipe 11 extends through a side of housing 2 to be joined to a side of heating block 1. Alternatively, material feed pipe 11 may extend from the lower surface of heating block 1 to main header pipe 12, or through flange 3 to reach main header pipe 12 As long as the material to be heated is fed to main header pipe 12 formed in heating block 1, the material may proceed through any path.

As for the direction of extension of main header pipe 12, branch header pipe 13, and riser pipe 14 included in the flow path for the material to be heated, as well as condensation hole 10 and condensation pit 16 included in the condensation path, the direction as described is defined as horizontal direction or vertical direction. The direction along which the flow path and the condensation path extend, however, may not be exactly parallel with the horizontal or vertical direction, and may be inclined instead. Further, the flow path and the condensation path are not limited to linear pipe and linear pit, and may include a bent or curved pipe or hole.

While the embodiments of the present invention have been explained, respective features of the embodiments may be combined as appropriate. It should be construed that the embodiments disclosed herein are by way of illustration in all respects, not by way of limitation. It is intended that the scope of the present invention is defined by claims, not by the above description of the embodiments, and includes all modifications and variations equivalent in meaning and scope to the claims.

INDUSTRIAL APPLICABILITY

The present invention is applicable particularly advantageously to a heating apparatus for heating a material that is a predetermined material carried in a container, and thereby causing the material to be melt and evaporated for the purpose of forming a film of the predetermined material on a surface of a substrate.

The invention claimed is:

1. A heat equalizer for vaporizing a material comprising:
a container structure having a closed space which is formed in the container structure and in which a working fluid is held;
heating means placed at a bottom of said container structure; and
a material feed pipe allowing an outside and an inside of said container structure to communicate with each other;
said container structure having a heating block for heating and vaporizing the material to be heated, and a housing surrounding said heating block, wherein
in said heating block, a flow path in which the material to be heated flows, and a condensation path in which the working fluid having been heated and evaporated by said heating means is cooled and condensed are formed,
said flow path includes a first flow path connected to said material feed pipe and extending in a horizontal direction, a second flow path branching from said first flow path and extending in a vertical direction, and an opening formed by an opening of said second flow path at an upper surface of said container structure,
said condensation path includes upper condensation holes formed respectively on opposite sides of said second flow path and extending in the horizontal direction, and a lower condensation pit formed under said first flow path, and
said first flow path is placed between said upper condensation holes and said lower condensation pit.

2. The heat equalizer according to claim 1, wherein
said lower condensation pit is provided in a whole region of said first flow path.

3. The heat equalizer according to claim 2, wherein
said upper condensation holes are extended along said second flow path.

4. The heat equalizer according to claim 2, further comprising:
a pipe system coupled to said opening; and
heating equipment for heating said pipe system, wherein
a temperature of said pipe system and a temperature of said container structure are separately controlled.

5. The heat equalizer according to claim 2, wherein
in at least one of a path in which said working fluid flows and a path in which said material to be heated flows, a passivation film containing a metal oxide is formed.

6. An organic film forming apparatus using the heat equalizer as recited in claim 2.

7. The heat equalizer according to claim 1, wherein
said upper condensation holes are extended along said second flow path.

8. The heat equalizer according to claim 1, wherein
said upper condensation holes have a bottom surface inclined to allow said working fluid to return to a bottom portion of said container structure.

9. The heat equalizer according to claim 8, wherein
said upper condensation holes have a horizontal ceiling surface.

10. The heat equalizer according to claim 9, wherein
said upper condensation holes located respectively on two opposite sides of said second flow path and adjacent to each other have respective bottom surfaces inclined in different directions from each other.

11. The heat equalizer according to claim 8, wherein
said upper condensation holes located respectively on two opposite sides of said second flow path and adjacent to each other have respective bottom surfaces inclined in different directions from each other.

12. The heat equalizer according to claim 1, further comprising:
a pipe system coupled to said opening; and
heating equipment for heating said pipe system, wherein
a temperature of said pipe system and a temperature of said container structure are separately controlled.

13. The heat equalizer according to claim 1, wherein
in at least one of a path in which said working fluid flows and a path in which said material to be heated flows, a passivation film containing a metal oxide is formed.

14. An organic film forming apparatus using the heat equalizer as recited in claim 1.

* * * * *